United States Patent
Lee et al.

(10) Patent No.: US 10,384,930 B2
(45) Date of Patent: Aug. 20, 2019

(54) SYSTEMS AND METHODS FOR PROVIDING GETTERS IN MICROELECTROMECHANICAL SYSTEMS

(71) Applicant: InvenSense, Inc., San Jose, CA (US)

(72) Inventors: Daesung Lee, San Jose, CA (US); Jeff Chunchieh Huang, Fremont, CA (US); Jongwoo Shin, Pleasanton, CA (US); Bongsang Kim, Mountain View, CA (US); Logeeswaran Veerayah Jayaraman, Milpitas, CA (US)

(73) Assignee: INVENSENSE, INC., San Jose, CA (US)

(*) Notice: Subject to any disclaimer, the term of this patent is extended or adjusted under 35 U.S.C. 154(b) by 0 days.

(21) Appl. No.: 15/497,676

(22) Filed: Apr. 26, 2017

(65) Prior Publication Data

US 2018/0312396 A1    Nov. 1, 2018

(51) Int. Cl.
*B81B 7/00* (2006.01)
*B81C 1/00* (2006.01)
*B81B 3/00* (2006.01)
*B81B 7/02* (2006.01)

(52) U.S. Cl.
CPC .......... *B81B 7/0038* (2013.01); *B81B 3/0008* (2013.01); *B81B 7/02* (2013.01); *B81C 1/00285* (2013.01); *B81B 2201/0235* (2013.01); *B81B 2201/0242* (2013.01); *B81B 2207/012* (2013.01); *B81C 2203/0118* (2013.01)

(58) Field of Classification Search
CPC .......... B81B 7/0038; B81B 2201/0242; B81B 2201/0235; B81B 7/00285; B81B 7/00038; B81C 1/00285
See application file for complete search history.

(56) References Cited

U.S. PATENT DOCUMENTS

| 2003/0141802 | A1* | 7/2003 | Liebeskind | H01J 29/94 313/495 |
|---|---|---|---|---|
| 2015/0158720 | A1 | 6/2015 | Lim | |
| 2015/0360939 | A1 | 12/2015 | Zhang et al. | |
| 2017/0297904 | A1* | 10/2017 | Lin | B81B 7/0038 |

OTHER PUBLICATIONS

International Search Report and Written Opinion for Patent Application No. PCT/US2018/029346 dated Jul. 5, 2018, 12 pages.

* cited by examiner

*Primary Examiner* — Wael M Fahmy
*Assistant Examiner* — Sarah K Salerno
(74) *Attorney, Agent, or Firm* — Amin, Turocy & Watson, LLP

(57) ABSTRACT

Systems and methods are provided that provide a getter in a micromechanical system. In some embodiments, a microelectromechanical system (MEMS) is bonded to a substrate. The MEMS and the substrate have a first cavity and a second cavity therebetween. A first getter is provided on the substrate in the first cavity and integrated with an electrode. A second getter is provided in the first cavity over a passivation layer on the substrate. In some embodiments, the first cavity is a gyroscope cavity, and the second cavity is an accelerometer cavity.

24 Claims, 26 Drawing Sheets

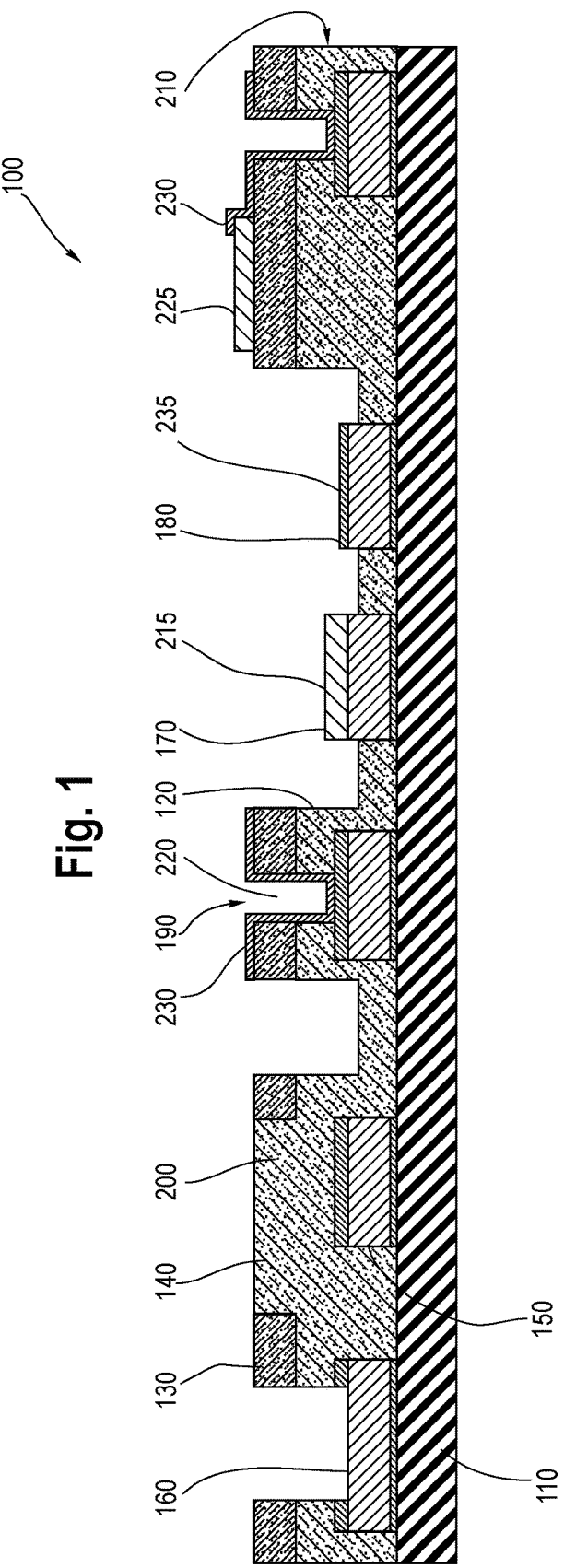

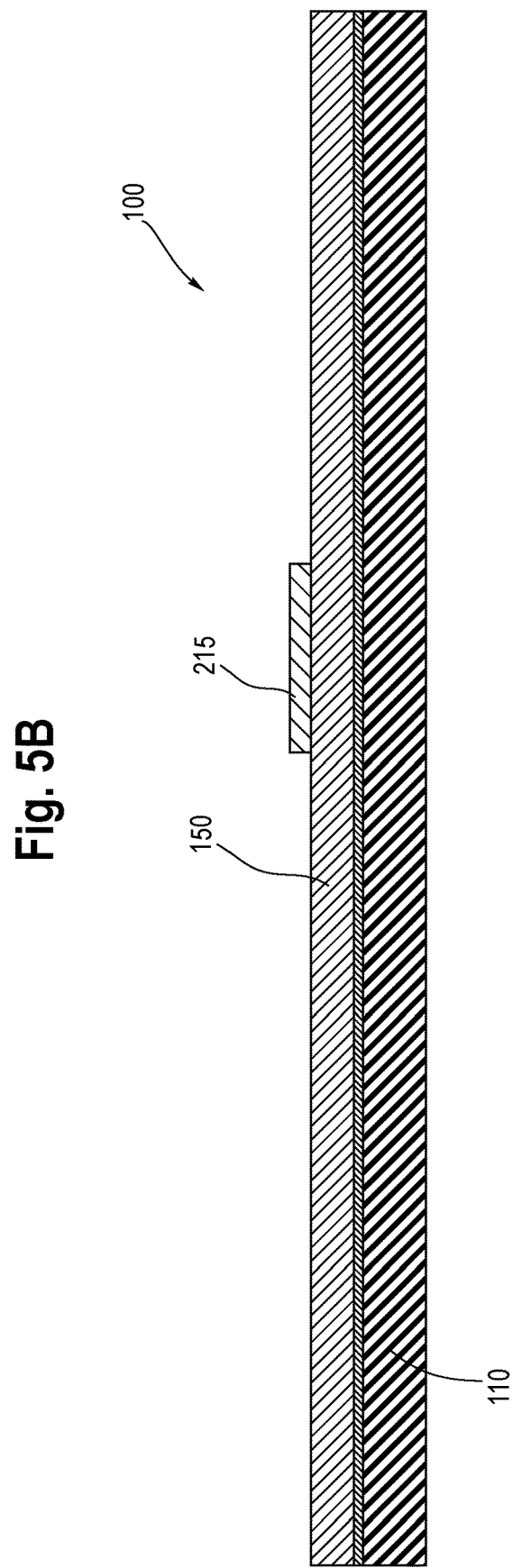

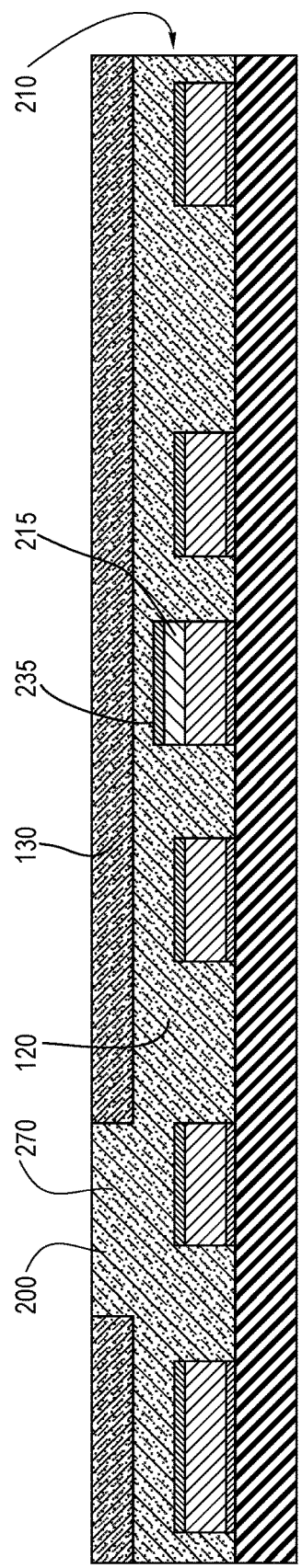

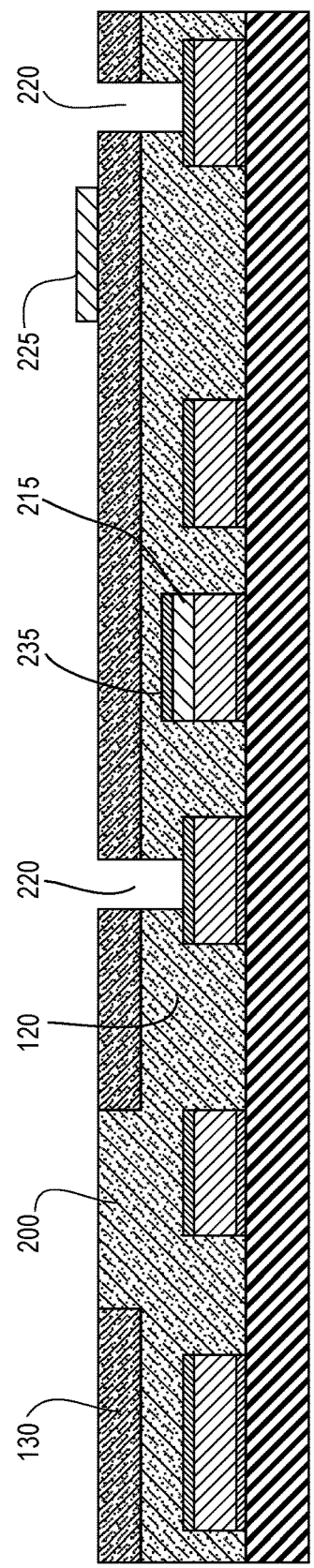

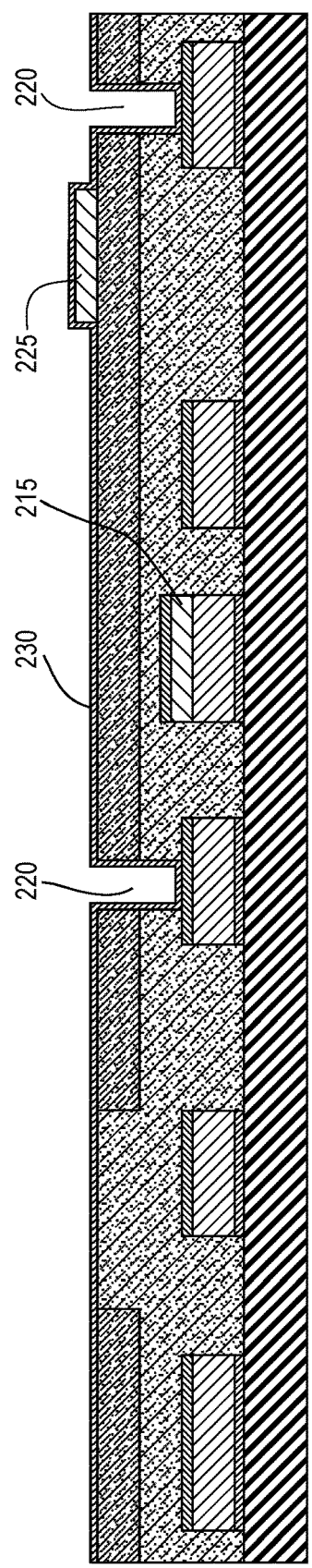

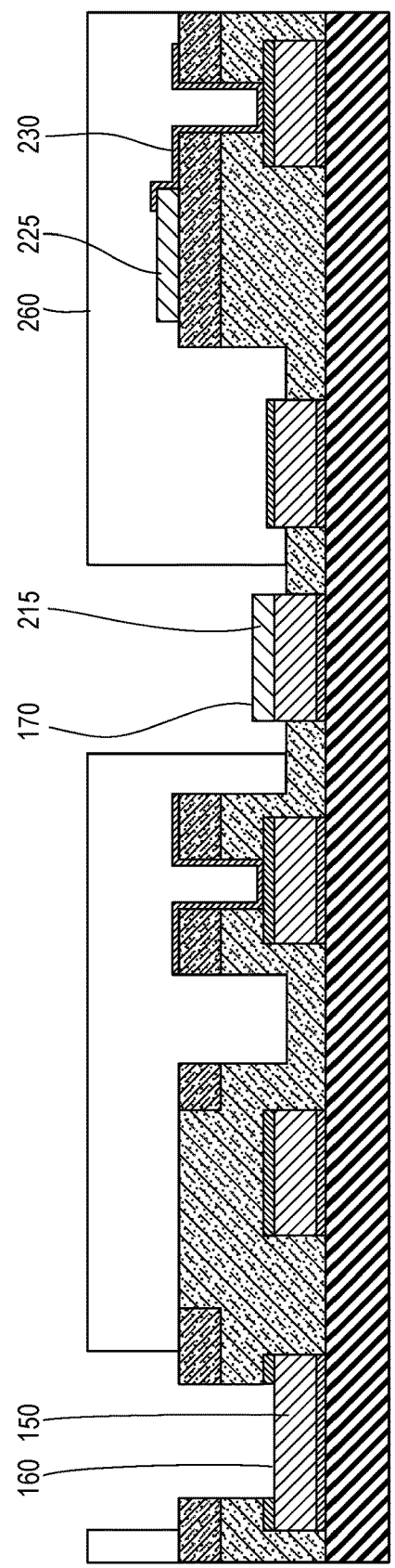

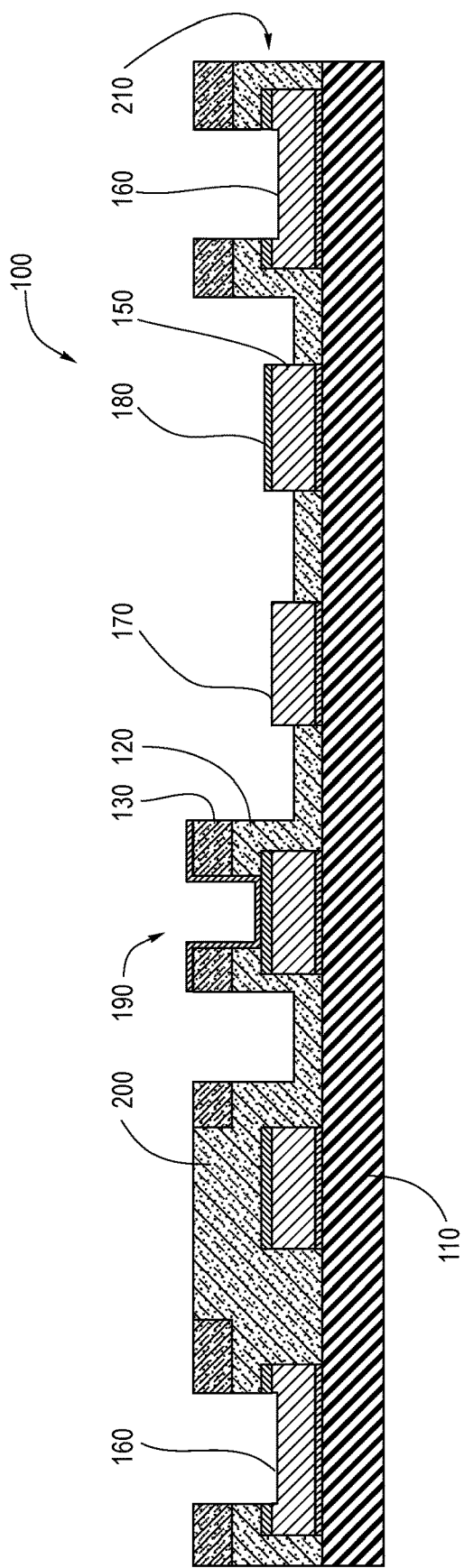

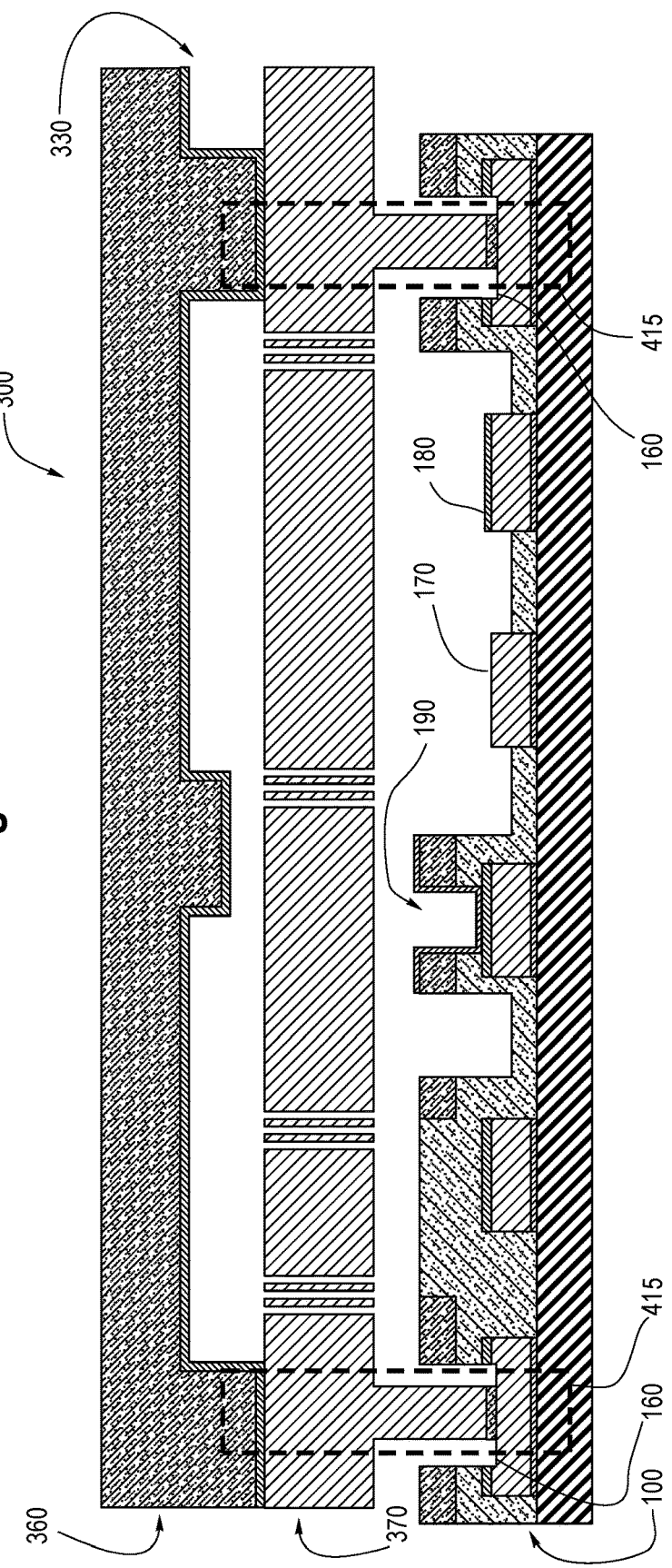

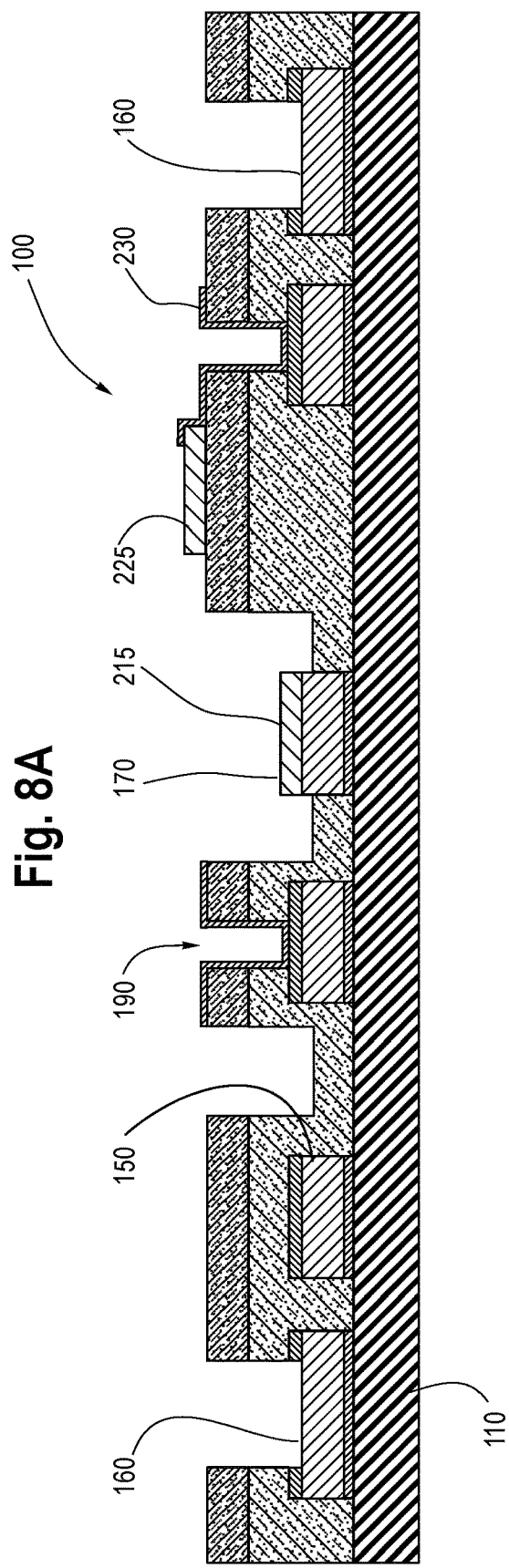

US 10,384,930 B2

SYSTEMS AND METHODS FOR PROVIDING GETTERS IN MICROELECTROMECHANICAL SYSTEMS

FIELD OF THE DISCLOSURE

Certain embodiments of the disclosure relate to systems and methods that provide getters in microelectromechanical systems (MEMS).

BACKGROUND OF THE DISCLOSURE

MEMS are a class of devices that can be fabricated and can exhibit particular mechanical and/or electrical characteristics. For example, MEMS devices can include the ability to move or deform. In some cases, but not all, MEMS can interact with electrical signals. A MEMS device can refer to a semiconductor device that can be implemented as a microelectromechanical system. A MEMS device can include, for example, mechanical elements and/or electronics (e.g., sensor electronics). MEMS devices can include, for example, gyroscopes, accelerometers, magnetometers, pressure sensors, etc.

Limitations and disadvantages of conventional and traditional approaches will become apparent to one of skill in the art, through comparison of such systems with the present disclosure as set forth in the remainder of the present application with reference to the drawings.

BRIEF SUMMARY OF THE DISCLOSURE

Systems and methods that provide getters in MEMS are provided substantially as illustrated by and/or described in connection with at least one of the figures, as set forth more completely in the claims.

Various advantages, aspects and novel features of the present disclosure, as well as details of an illustrated embodiment thereof, will be more fully understood from the following description and drawings.

BRIEF DESCRIPTION OF SEVERAL VIEWS OF THE DRAWINGS

FIG. 1 shows an embodiment of a complementary metal oxide semiconductor (CMOS) wafer according to the present disclosure.

FIG. 5B shows an embodiment of a portion of a process flow according to the present disclosure.

FIG. 5G shows an embodiment of a portion of a process flow according to the present disclosure.

FIG. 5I shows an embodiment of a portion of a process flow according to the present disclosure.

FIG. 5J shows an embodiment of a portion of a process flow according to the present disclosure.

FIG. 5M shows an embodiment of a portion of a process flow according to the present disclosure.

FIG. 7A shows an embodiment of an accelerometer portion of the MEMS device according to the present disclosure.

FIG. 7C shows an embodiment of an accelerometer portion of the MEMS device according to the present disclosure.

FIG. 8A shows an embodiment of a gyroscope portion of the MEMS device according to the present disclosure.

DETAILED DESCRIPTION OF THE DISCLOSURE

Figure 2A:
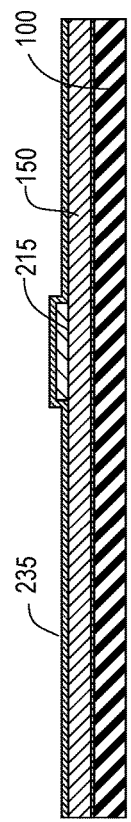
FIG. 2A show an embodiment of a portion of a process flow according to the present disclosure.

As utilized herein, "and/or" means any one or more of the items in the list joined by "and/or". As an example, "x and/or y" means any element of the three-element set {(x), (y), (x, y)}. That is, "x and/or y" means "one or both of x and y." As another example, "x, y, and/or z" means any element of the seven-element set {(x), (y), (z), (x, y), (x, z), (y, z), (x, y, z)}. That is, "x, y, and/or z" means "one or more of x, y, and z." As utilized herein, the terms "e.g.," and "for example," "exemplary," and the like set off lists of one or more non-limiting examples, instances, or illustrations.

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc., may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "lower," "side," and the like, may be used in distinguishing one element from another element in a relative manner. It should be understood, however, that components may be oriented in different manners, for example an electronic or MEMS device may be turned sideways so that its "top" surface is facing horizontally and its "side" surface is facing vertically, without departing from the teachings of the present disclosure.

Some embodiments according to the present disclosure include systems and methods that provide getters in MEMS.

Some embodiments according to the present disclosure provide for a getter that is used with a cavity in a MEMS device. In some embodiments, the cavity is at or near a vacuum pressure. The getter can be configured to lower a pressure in the cavity and/or to provide a stable pressure in the cavity over the lifetime of the MEMS device. A stable cavity pressure can, for example, reduce gyroscope offset shifts over the lifetime of the MEMS device. The getter can be configured to be activated at high temperatures and/or to absorb unwanted gas species (e.g., gas species that are outgassed from a surface of the cavity at high temperatures) in the cavity.

Some embodiments according to the present disclosure provide for six-axis MEMS devices that employ getters. The MEMS device can also include, for example, AlCu electrodes from a top metal to form sensing, shield, and/or bonding electrodes; and conductive bump stops (e.g., using TiN) with charge dissipation paths.

FIG. 1 shows an embodiment of a complementary metal oxide semiconductor (CMOS) wafer 100 that is configured to bond with a MEMS wafer (not shown). A MEMS device can be formed by bonding a MEMS wafer with the CMOS wafer 100. Some embodiments according to the present disclosure provide a MEMS device that includes a cavity with one or more getters.

Referring to FIG. 1, the CMOS wafer 100 can include, for example, a substrate 110, an oxide layer 120, a silicon rich oxide (SRO)/silicon nitride (SiN) layer 130, a high density plasma (HDP) oxide layer 140, a top metal layer or AlCu layer 150, a barrier layer 235 (e.g., a capping layer) and getters 215, 225. The top metal 150 (e.g., AlCu) is disposed on top of a substrate 110 of the CMOS wafer 100. A passivation stack 210, which can include the oxide layer 120 and the SRO/SiN layer 130, is formed around the top metal 150. In some embodiments, SRO is a bottom layer and SiN is a top layer of the SRO/SiN layer 130. A conductive bump stop layer 230 is disposed on top the passivation stack 210 and inside a via 220.

Some of the structures of the CMOS wafer 100 include, for example, bonding electrodes 160 (e.g., bonding pads), a shield or sensing electrode 170, a shield or sensing electrode 180, a conductive bump stop 190, an outgassing layer 200, the via 220, and getters 215, 225. The CMOS wafer 100 can also include, for example, CMOS circuitry (not shown). The CMOS circuitry can be coupled to the MEMS wafer through the bonding electrodes 160. For example, the MEMS wafer can be structurally bonded and/or electrically connected to the CMOS wafer 100 through the bonding electrodes 160.

When the CMOS wafer 100 and the MEMS wafer are bonded to form the MEMS device, cavities are also formed within the MEMS device. In some embodiments, one of the cavities is an accelerometer cavity; another one of the cavities is a gyroscope cavity. In some embodiments, the getters 215, 225 are within one of the cavities (e.g., a gyroscope cavity). When heated, for example, during operation, the getters 215, 225 absorb particular gas species, thereby reducing the pressure or stabilizing the pressure within the gyroscope cavity of the MEMS device.

Figure 2B:
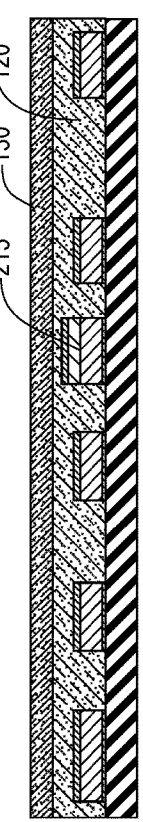
FIG. 2B show an embodiment of a portion of a process flow according to the present disclosure.
Figure 2C:
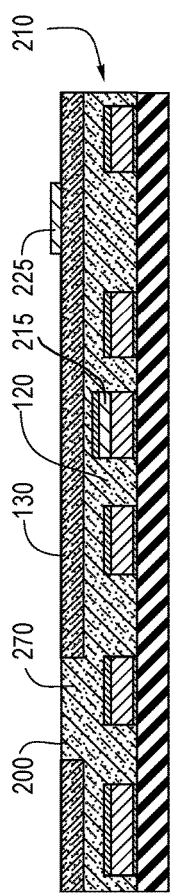
FIG. 2C show an embodiment of a portion of a process flow according to the present disclosure.
Figure 2D:
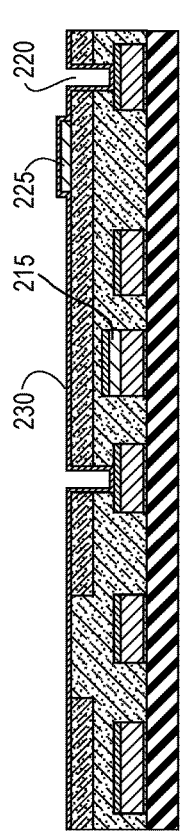
FIG. 2D show an embodiment of a portion of a process flow according to the present disclosure.
Figure 2E:
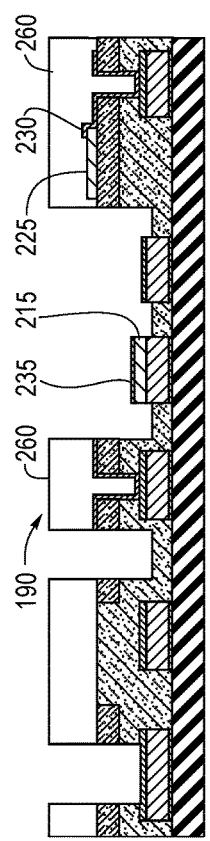
FIG. 2E show an embodiment of a portion of a process flow according to the present disclosure.

FIGS. 2A-F show an overview of an embodiment of a process flow according to the present disclosure. Some embodiments provide that the process flow integrates the getters 215, 225 with the top metal layer 150 and/or the passivation layer 210. In particular, FIGS. 2A, 2B, 2E, and 2F show portions of an embodiment of a process flow for getter 215 integration in top metal 150. FIGS. 2C-E show portions of an embodiment of a process flow for getter 225 integration on the passivation layer 210.

FIG. 2A shows getter 215 deposition and patterning on the top metal layer 150 (e.g., AlCu) and barrier layer deposition. In some embodiments, the top metal layer 150 is deposited on the substrate 110 of the CMOS wafer 100. The getter layer 215 (e.g., Ti) is deposited on the top metal layer 150 and patterned. A barrier layer 235 (e.g., TiN) is deposited on the getter 215 and the top metal layer 150.

FIG. 2B shows top metal layer 150 patterning and passivation stack 210 deposition. In some embodiments, the top metal layer 150, getter 215, and the barrier layer 235 are patterned. A passivation stack 210 including the oxide layer 120 and the SRO/SiN layer 130 are deposited on the patterned top metal layer 150, barrier layer 235, and getter 215.

FIG. 2C shows the creation of a high density plasma (HDP) oxide layer 140 and a second getter layer 225 deposition and patterning. In some embodiments, an HDP oxide mask is used and a SRO/SiN layer 130 etch is performed to remove SRO/SiN from area 270. The outgassing layer 200 can be formed by HDP oxide deposition in the etched area 270 and chemical-mechanical polishing (CMP). The second getter layer 225 (e.g., Ti) is deposited on the passivation stack 210 (e.g., on the SRO/SiN layer 130 of the passivation stack 210) and patterned.

FIG. 2D shows via 220 formation and conductive layer 230 deposition. In some embodiments, a via 220 is formed through the passivation stack 210 of the bump stop 190 to the barrier layer 235 on top of the top metal layer 150 (e.g., AlCu). The conductive bump stop layer 230 (e.g., Ti/TiN) is deposited over the passivation stack 210, the outgassing layer 200, the via 220 (including, for example, side walls of the via 220), and the getter 225.

FIG. 2E shows conductive layer 230 patterning and PAD etch. In some embodiments, the conductive bump stop layer 230 is patterned such that the conductive bump stop layer 230 remains over the conductive bump stop 190. The conductive bump stop layer 230 is also patterned such that a portion of the conductive bump stop layer 230 remains on top of the getter 225, thereby forming a conductive path from the getter 225 to top metal layer 150. A PAD etch is performed through the passivation stack 210 and stopped at the capping layer. The PAD etch may remove a portion of the barrier layer 235 over the top metal layer 150.

Figure 2F:
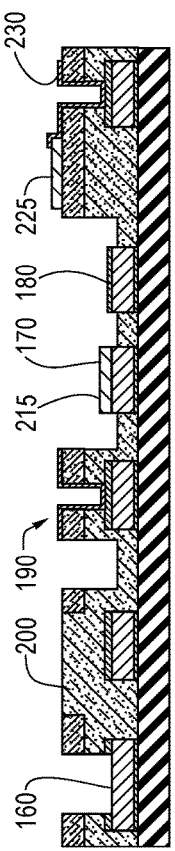
FIG. 2F show an embodiment of a portion of a process flow according to the present disclosure.

FIG. 2F shows a selective etch of the capping layer. In some embodiments, the barrier layer 235 is removed from a portion of the bonding electrode 160 and is removed from the shield and/or sensing electrode 170. With respect to the shield and/or sensing electrode 170, the etching of the barrier layer 235 exposes the getter layer 215, which forms the shield/sensing electrode.

Figure 3A:
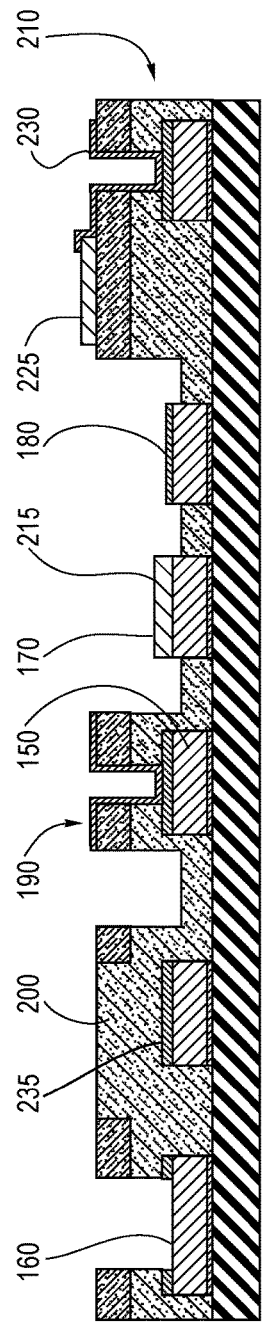
FIG. 3A show a first embodiment of getter integration with a CMOS wafer according to the present disclosure.
Figure 3B:
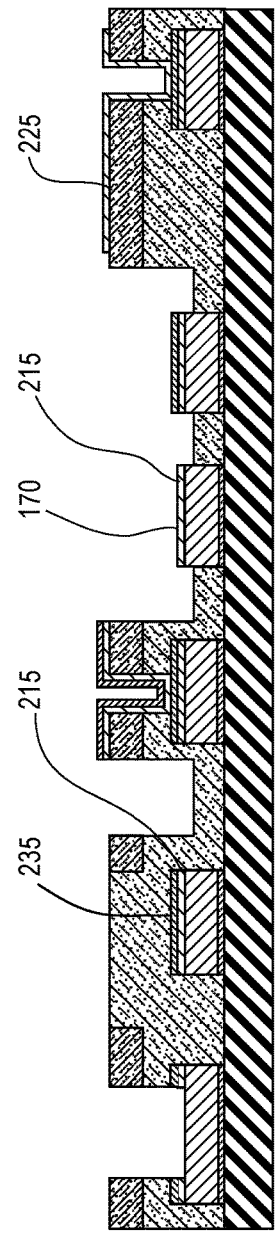
FIG. 3B shows a first embodiment of getter integration with a CMOS wafer according to the present disclosure.
Figure 3C:
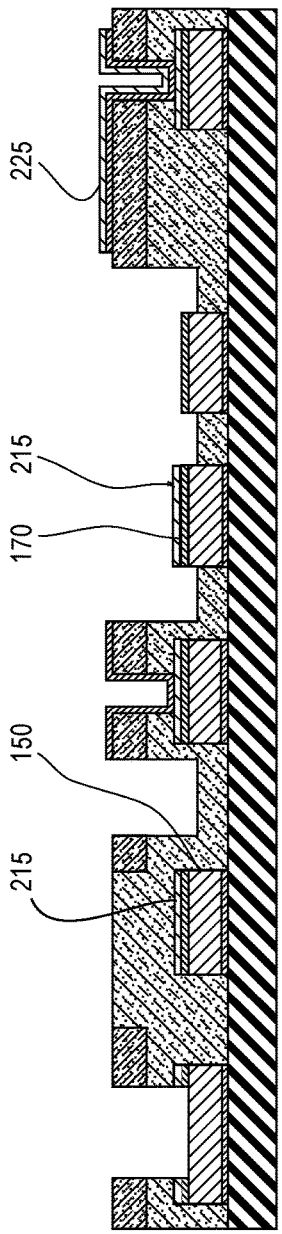
FIG. 3C shows a first embodiment of getter integration with a CMOS wafer according to the present disclosure.

FIGS. 3A-C show three embodiments of getter 215, 225 integration with a CMOS wafer 100. In addition, FIGS. 3A-C show different embodiments of a first getter 215 and different embodiments of a second getter 225. Some embodiments of the present disclosure contemplate combining different embodiments of the first getter 215 (e.g., the first getter 215 in FIG. 3C) with different embodiments of the second getter 225 (e.g., the second getter 225 in FIG. 3A), including combinations that are not illustrated in FIGS. 3A-C.

FIG. 3A shows a first approach of getter 215, 225 integration based on a wrap-around structure of the getter layer 215 with a capping layer 235. In some embodiments, the getter 215 is deposited on a top metal layer 150 and patterned. The capping layer 235 is then deposited over the getter 215 and the top metal layer 150. In subsequent steps, the capping layer 235 is removed to expose the underlying getter 215. Further, the getter 225, which is deposited on the passivation stack 210, is electrically coupled to the top metal layer 150 via a conductive bump stop layer 230 that has been selectively removed to expose a portion of the getter 225. In some embodiments, the conductive bump stop 190 provides, for example, a charge dissipation path when moving structures of the MEMS device come into contact with the CMOS wafer 100. In some embodiments, the combination of the getter 225 and the conductive bump stop layer 230 are not intended to function as a conductive bump stop.

FIG. 3B shows a second approach of getter 215, 225 integration. In some embodiments, stacks are formed with the capping layer 235 on top of the getter layer 215 which is on top of the top metal layer 150. In subsequent steps, the capping layer 235 is selectively removed to expose the underlying getter 215. Further, the getter layers 215, 225 are electrically coupled to the top metal layer 150. The getter 215 provides an electrode layer for the shield/sensing electrode 170. In some embodiments, the stack of the getter layer 225 and the conductive bump stop layer 230 serves as an overall conductive bump stop layer for the conductive bump stop 190.

FIG. 3C shows a third approach of getter 215, 225 integration. In some embodiments, a stack is formed with an electrode layer 235 and the getter layer 215. In subsequent steps, the getter layer 215 is selectively removed to expose the underlying electrode layer 235. Further, the getter layers 215, 225 are electrically coupled to the top metal layer 150.

The getter 215 provides an electrode layer for the shield/sensing electrode 170 and is electrically coupled to the top metal layer 150 via the electrode layer 235. In some embodiments, the conductive bump stop layer 230 serves as the conductive bump stop layer of the conductive bump stop 190. In some embodiments, the stack of the getter 225 on top of the conductive bump stop layer 230 does not serve as a conductive bump stop, and structure underneath the getter 225 is not serving as a conductive bump stop. The getter 225 is electrically coupled to the top metal layer 150 through the electrode layer or conductive layer 230 and the via 220.

Under some circumstances, some approaches have particular advantages over other approaches. For example, the first approach decouples the material selection of the getter layer 225 and the conductive bump stop layer 230, and decouples the material selection of the getter layer 215 and the electrode layer 235 on the top metal layer 150. Further, the etching of the getter 225 on the passivation layer 210 in the first approach can be achieved using a wet etch or a dry etch. Further, the first approach allows for the design of getter thickness to be sufficiently thick so as to maximize the getter capacity and process window.

FIGS. 4A-I show an embodiment of a process flow of the second approach according to the present disclosure.

Figure 4A:
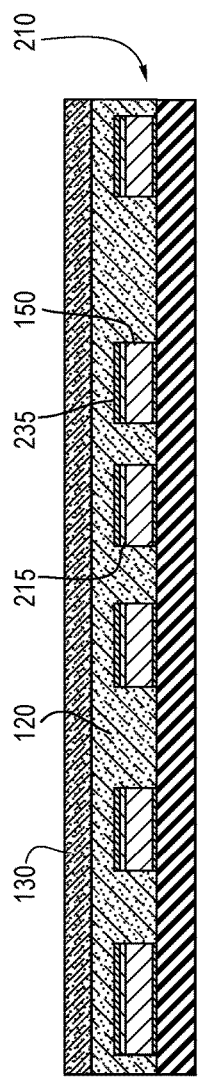
FIG. 4A shows an embodiment of a portion of a process flow according to the present disclosure.

FIG. 4A shows a passivation stack 210 deposition over the top metal layer 150. In some embodiments, the top metal layer 150 (e.g., AlCu) is deposited on the substrate 110 of the CMOS wafer 100. The first getter layer 215 is deposited on top of the top metal layer 150 (e.g., Ti), and a barrier layer 235 (e.g., TiN) is deposited over the first getter layer 215. After the top metal layer 150, the first getter layer 215, and the barrier layer 235 are patterned, a passivation stack 210 is deposited over the top metal layer 150, the first getter layer 215, and the barrier layer 235. The passivation stack 210 can include, for example, an oxide layer 120 and a SRO/SiN layer 130.

Figure 4B:
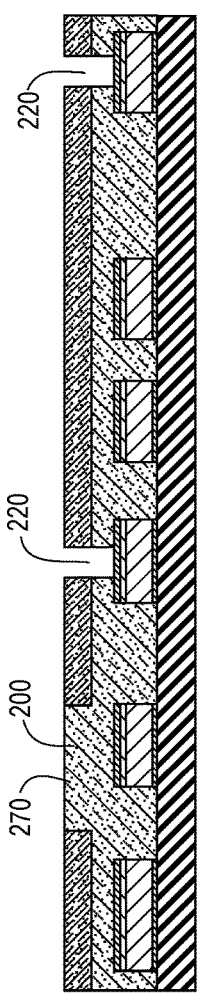
FIG. 4B shows an embodiment of a portion of a process flow according to the present disclosure.

FIG. 4B shows the formation of an outgassing layer 200 followed by via 220 formation. In some embodiments, an outgassing layer 200 can be formed by an HDP oxide mask and a SRO/SiN layer 130 etch to remove SRO/SiN from area 270. The outgassing layer 200 can be formed by HDP oxide deposition in the etched area 270 and chemical-mechanical polishing (CMP). Subsequently, the vias 220 are formed.

Figure 4C:
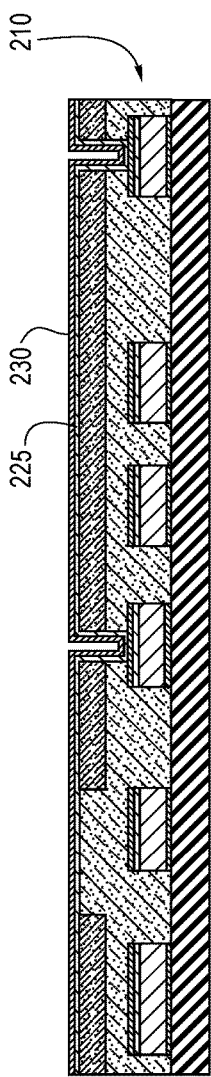
FIG. 4C shows an embodiment of a portion of a process flow according to the present disclosure.

FIG. 4C shows a getter and capping layer deposition. In some embodiments, the second getter layer 225 (e.g., Ti) is deposited on the passivation stack 210 and the outgassing layer 200. A conductive bump stop layer 230 (e.g., Ti/TiN) is deposited over the second getter layer 225. The depositions also cover the walls of the vias 220.

Figure 4D:
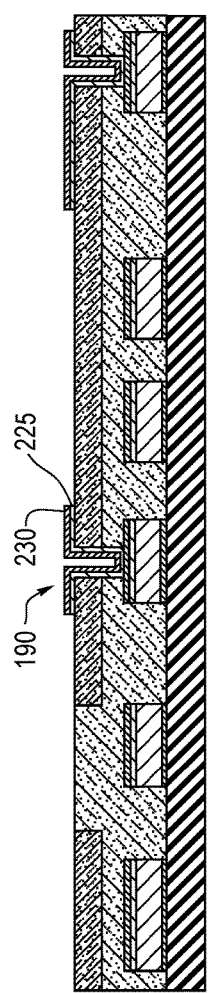
FIG. 4D shows an embodiment of a portion of a process flow according to the present disclosure.

FIG. 4D shows getter and capping layer patterning. In some embodiments, the second getter layer 225 and the conductive bump stop layer 230 is patterned such that portions remain over the bump stop 190 and in the location where the second getter 225 is placed.

Figure 4E:
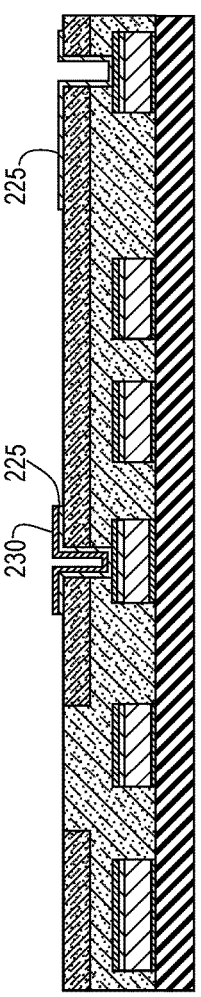
FIG. 4E shows an embodiment of a portion of a process flow according to the present disclosure.

FIG. 4E shows capping layer patterning. In some embodiments, the conductive bump stop layer 230 is patterned. A wet or a dry etch can be used to remove the conductive bump stop layer 230 over one of the remaining portions of the second getter layer 225.

Figure 4F:
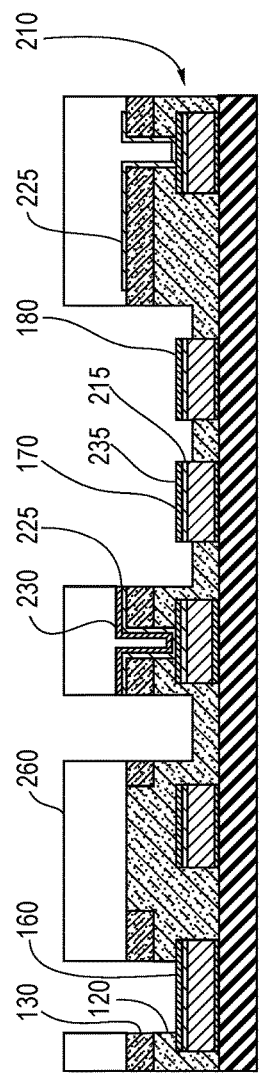
FIG. 4F shows an embodiment of a portion of a process flow according to the present disclosure.

FIG. 4F shows PAD lithography and etch followed by an alloy step. In some embodiments, PAD lithography and etch includes patterning using photoresist (PR) 260. The PR 260 selectively protects certain features from etching. The etching exposes the barrier layer 235 over the bonding electrode 160, the shield/sensing electrode 170, and the shield/sensing electrode 180. Subsequently, an alloy step is performed.

Figure 4G:
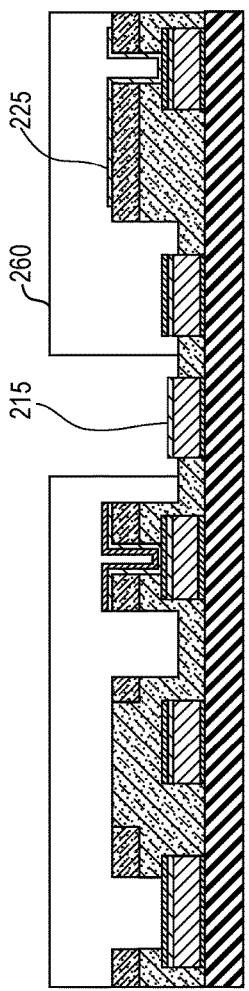
FIG. 4G shows an embodiment of a portion of a process flow according to the present disclosure.

FIG. 4G shows another PAD lithography and etch. In some embodiments, the second PAD lithography and etch results in the etching of the capping layer. The PR 260 is patterned such that the subsequent etch exposes the first getter layer 215 of the shield/sensing electrode 170.

Figure 4H:
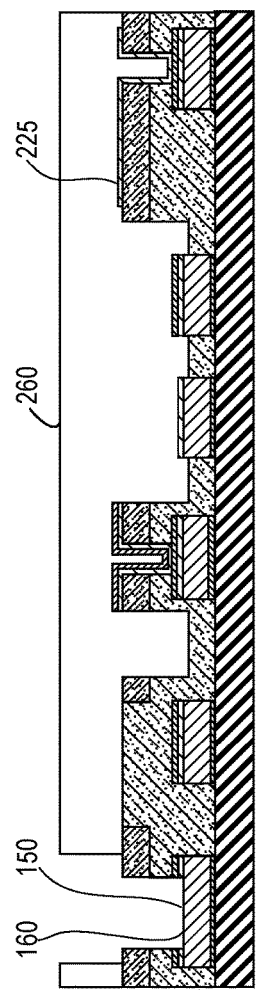
FIG. 4H shows an embodiment of a portion of a process flow according to the present disclosure.

FIG. 4H shows yet another PAD lithography and etch. In some embodiments, the third PAD lithography and etch results in etching the getter and capping layers. The PR 260 is patterned such that the subsequent etch exposes the top metal layer 150 of the bonding electrode 160 by removing a portion of the first getter layer 215 and the barrier layer 235 above the bonding electrode 160.

Figure 4I:
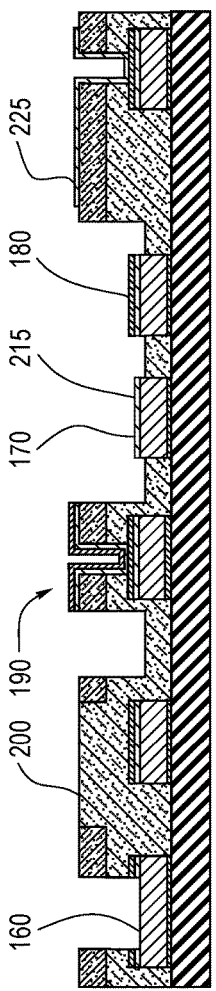
FIG. 4I shows an embodiment of a portion of a process flow according to the present disclosure.

FIG. 4I shows the PR 260 strip. The CMOS wafer 100 is ready for bonding with the MEMS wafer (not shown) to form a MEMS device.

Some embodiments of a process flow of the third approach as shown in FIG. 3C are similar in many aspects of the process flow of the second approach as shown in FIG. 3B and FIGS. 4A-I, for example, and described herein. One of ordinary skill in the art would understand how to implement the process flow of the second approach in view of disclosures of the process flow of the second approach and the first approach as described herein.

Figure 5A:
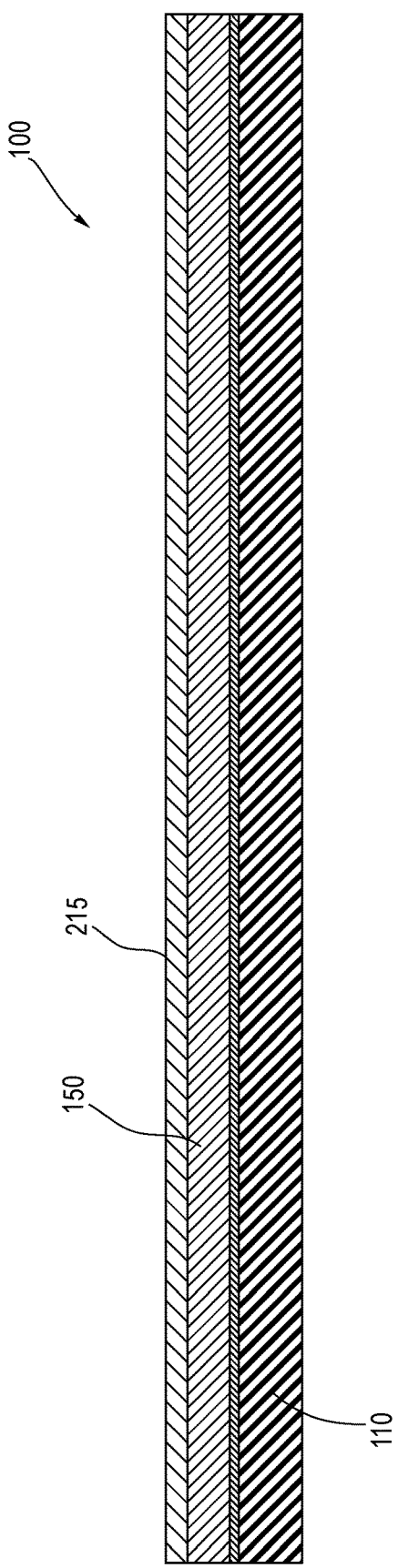
FIG. 5A shows an embodiment of a portion of a process flow according to the present disclosure.
Figure 5C:
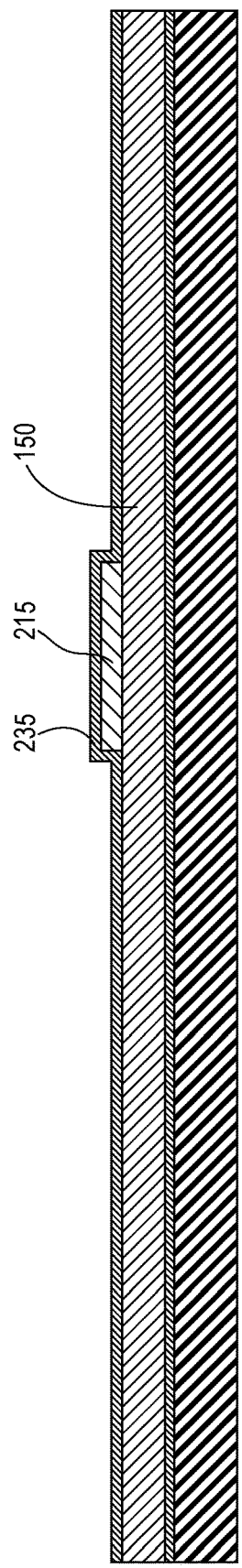
FIG. 5C shows an embodiment of a portion of a process flow according to the present disclosure.
Figure 5D:
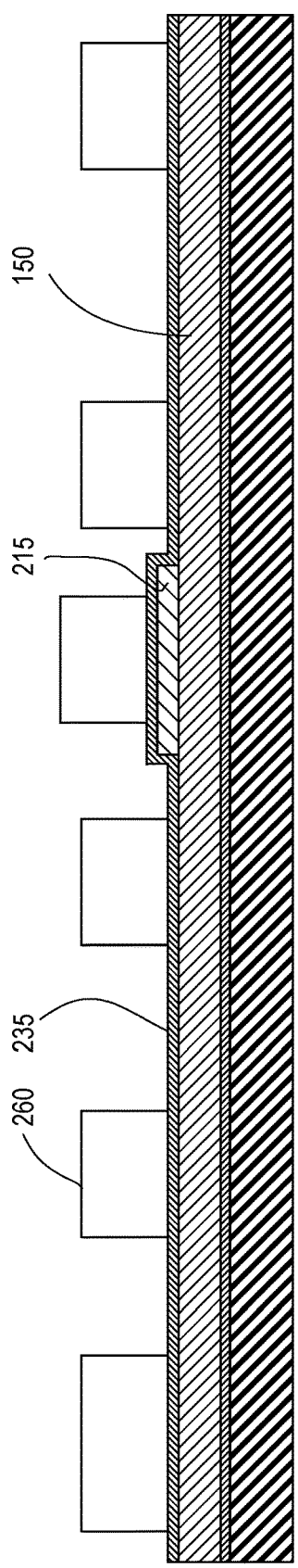
FIG. 5D shows an embodiment of a portion of a process flow according to the present disclosure.
Figure 5E:
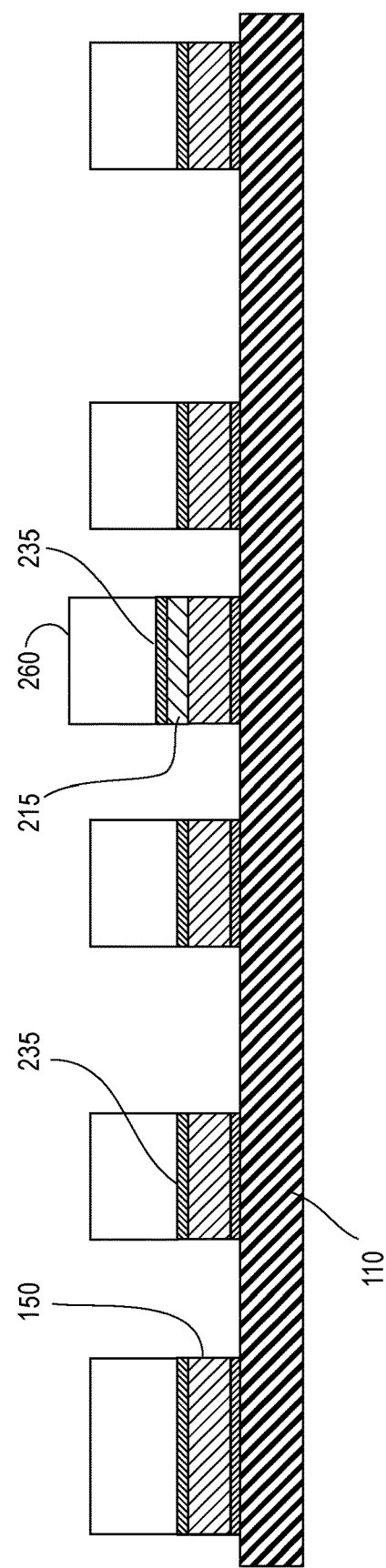
FIG. 5E shows an embodiment of a portion of a process flow according to the present disclosure.
Figure 5F:
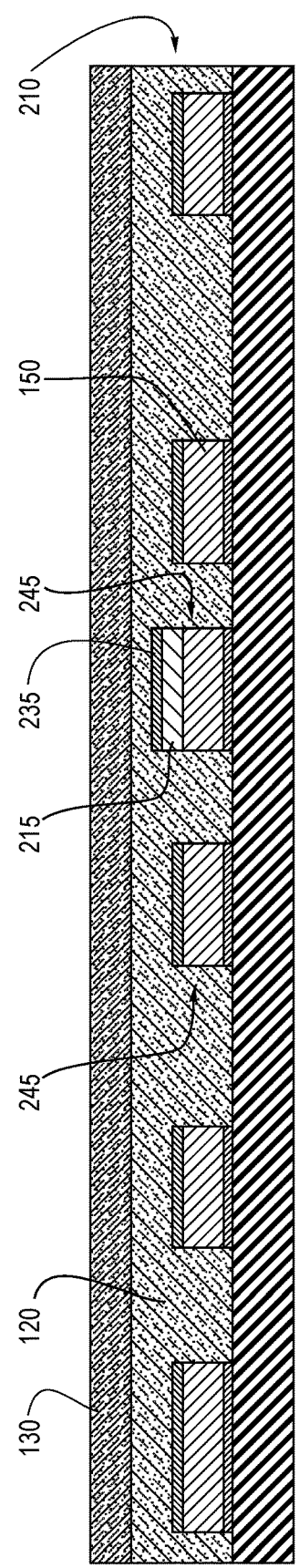
FIG. 5F shows an embodiment of a portion of a process flow according to the present disclosure.
Figure 5H:
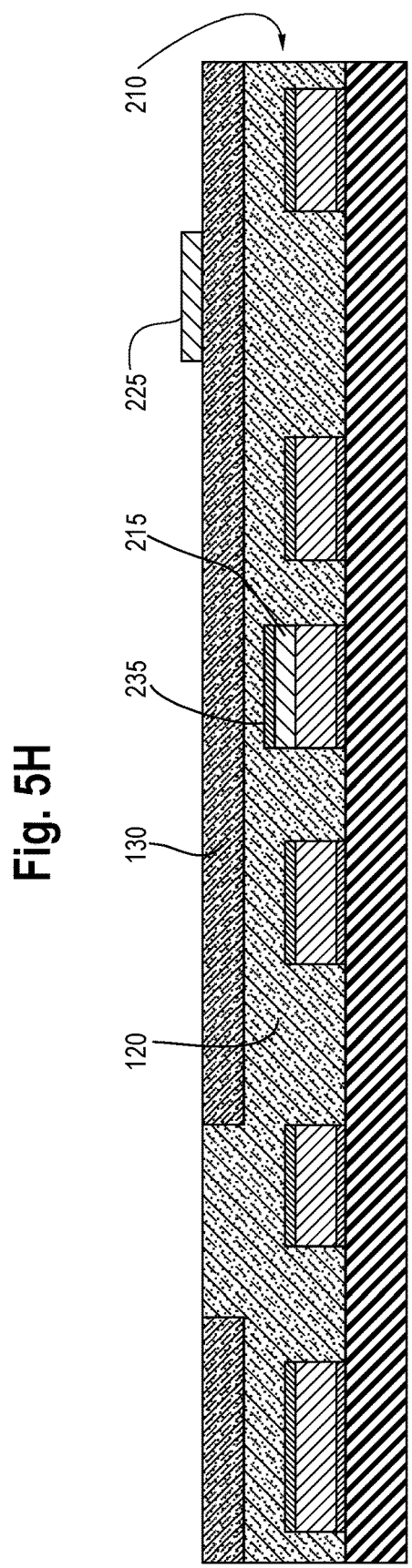
FIG. 5H shows an embodiment of a portion of a process flow according to the present disclosure.
Figure 5K:
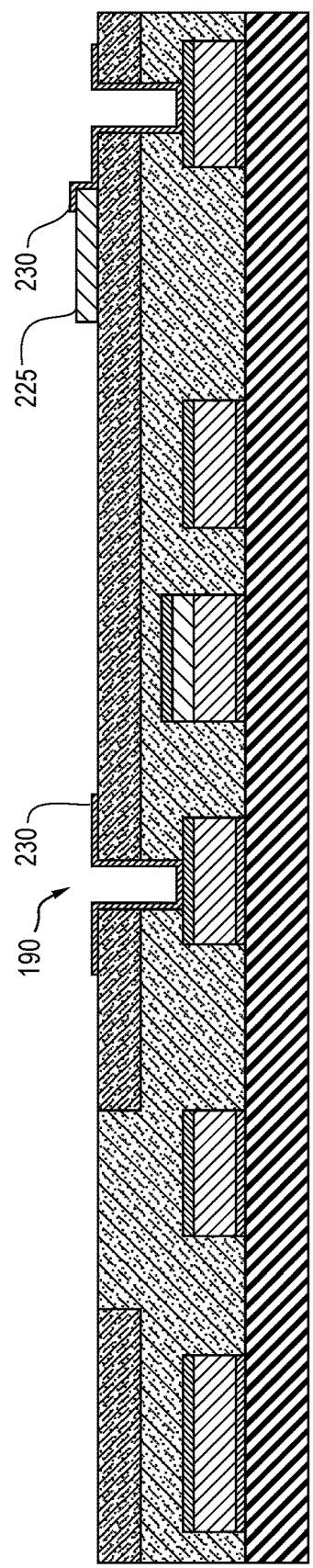
FIG. 5K shows an embodiment of a portion of a process flow according to the present disclosure.
Figure 5L:
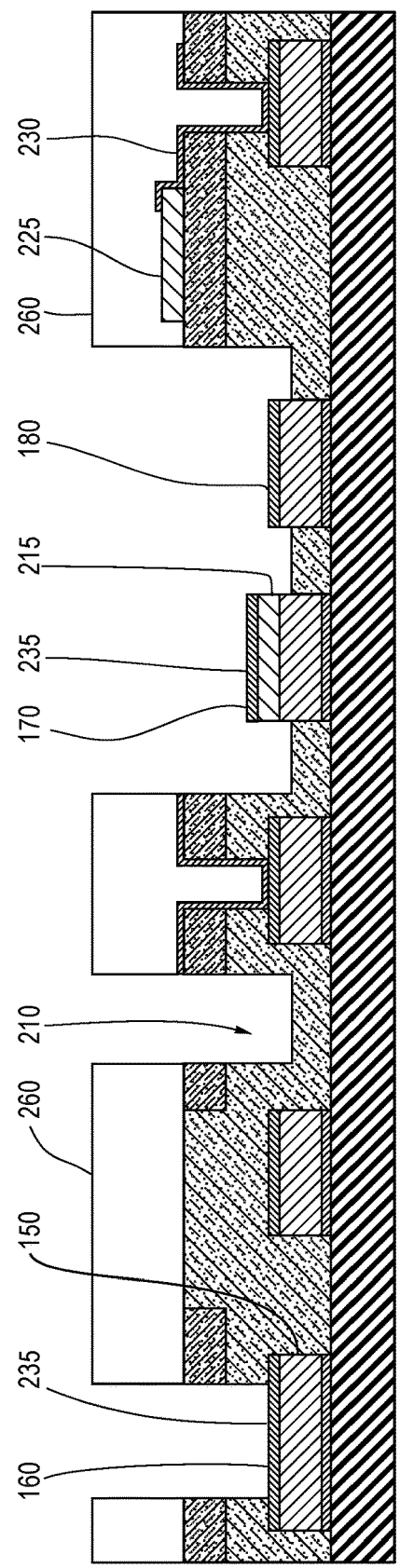
FIG. 5L shows an embodiment of a portion of a process flow according to the present disclosure.
Figure 5N:
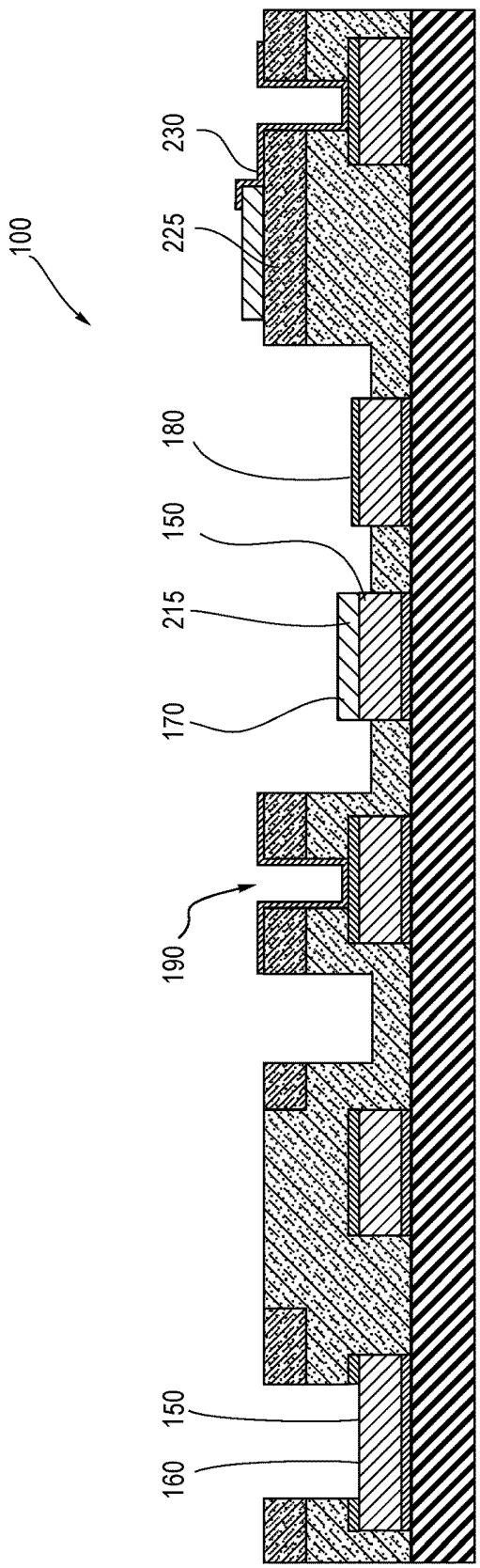
FIG. 5N shows an embodiment of a portion of a process flow according to the present disclosure.

FIGS. 5A-N show an embodiment of a process flow of the first approach according to the present disclosure.

FIG. 5A shows top metal layer deposition. In some embodiments, a top metal layer 150 (e.g., AlCu) is deposited on a substrate 110 of a CMOS wafer 100. A first getter layer 215 (e.g., Ti) is deposited on the top metal layer 150.

FIG. 5B shows getter layer patterning. In some embodiments, the first getter layer 215 is patterned.

FIG. 5C shows a barrier layer deposition. In some embodiments, a barrier layer 235 (e.g., TiN) is deposited over the top metal layer 150 and the first getter 215.

FIG. 5D shows top metal layer lithography. In some embodiments, PR 260 is deposited and patterned over the barrier layer 235, the first getter 215, and the top metal layer 150.

FIG. 5E shows a top metal layer etch. In some embodiments, the PR 260 protects certain structures from the etch. The etch selectively removes the barrier layer 235, the first getter layer 215, and the top metal layer 150 to expose the substrate 110 of the CMOS wafer 100.

FIG. 5F shows a PR strip and passivation stack deposition over the top metal layer. In some embodiments, the PR 260 is stripped and the passivation stack 210 is deposed over the substrate 110 and the top metal layer stacks 245 that include the barrier layer 235 over the top metal layer 150 or the barrier layer 235 over the first getter 215 and the top metal layer 150. The passivation stack 210 can include an oxide layer 120 deposited over the substrate 110 and the top metal layer stacks 245. The passivation stack 210 can also include a SRO/SiN layer 130 deposited over the oxide layer 120.

FIG. 5G shows an outgassing layer 200. In some embodiments, an HDP oxide mask is used, and a SRO/SiN etch is performed to remove SRO/SiN from area 270. The outgassing layer can be formed by HDP oxide deposition in the etched area 270 and CMP. In some embodiments, for a SiN capping process, SiN capping deposition can be added after HDP oxide deposition and CMP.

FIG. 5H shows getter deposition and patterning. In some embodiments, a second getter layer 225 is deposited over the SRO/SiN layer 130 and the outgassing layer 200. The second getter layer 225 is patterned as shown in FIG. 5H.

FIG. 5I shows bump stop via formation. In some embodiments, vias 220 are formed by removing the SRO/SiN layer 130 and the oxide layer 120 to expose the barrier layer 235 of a bump stop.

FIG. 5J shows bump stop layer deposition. In some embodiments, a conductive bump stop layer 230 (e.g., Ti/TiN) is deposited over the second getter 225, the SRO/SiN layer 130, and the outgassing layer 200. The conductive bump stop layer 230 is also deposited over the walls of the vias 220 and over the exposed barrier layer 235.

FIG. 5K shows bump stop layer patterning. In some embodiments, the conductive bump stop layer 230 is patterned and selectively etched to define the bump stop and expose the getter. A wet or dry etch can be used. Portions of the conductive bump stop layer 230 near the conductive bump stop 190 remain. A portion of the conductive bump stop layer 230 also remains over the second getter 225, although the rest of the second getter 225 is exposed.

FIG. 5L shows PAD lithography and etch followed by an alloy step. In some embodiments, PAD lithography and etch includes patterning using the PR 260 and selectively removing the passivation stack 210 (e.g., the SRO/SiN layer 130 and the oxide layer 120). The PR 260 selectively protects certain features from etching including, for example, the second getter layer 225. The second getter layer 225 is not exposed in this step. The etching can stop at the electrode layer (e.g., barrier layer 235) on the top metal layer 215 (e.g., AlCu). The etching exposes the barrier layer 235 over the bonding electrode 160, the shield/sensing electrode 170, and the shield/sensing electrode 180. The first getter layer 215 is not exposed in this step. Further, the etching defines the bump stop. In some embodiments, a portion of the barrier layer 235 is removed by the etching, for example, in the bonding electrode 160. Subsequently, an alloy step is performed.

FIG. 5M shows another PAD lithography and etch. In some embodiments, the second PAD lithography and etch results in the etching of the capping layer. The PR 260 is patterned such that the subsequent etch exposes the first getter layer 215 of the shield/sensing electrode 170. The etch also exposes the top metal layer 150 of the bonding electrode 160 by removing the barrier layer 235 (e.g., the electrode layer).

FIG. 5N shows the PR 260 strip. In some embodiments, the PR 260 is stripped. In some embodiments, an optional SiN etch step is performed for the SiN capping process prior to the PR 260 strip. The CMOS wafer 100 is ready for bonding with the MEMS wafer (not shown) to form a MEMS device.

Figure 6:
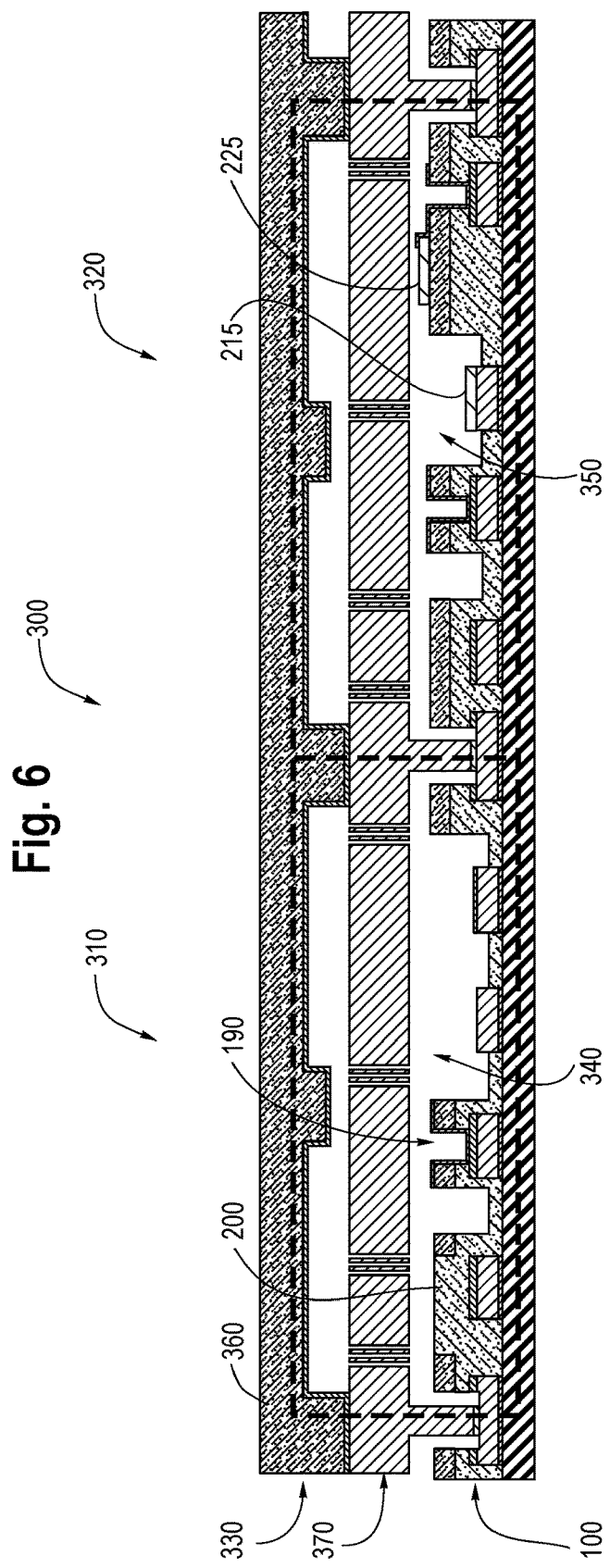
FIG. 6 shows an embodiment of a MEMS device according to the present disclosure.

FIGS. 6-8 show cross-sectional views of an embodiment of CMOS wafer to MEMS wafer bonding to form a dual cavity (e.g., an accelerometer cavity and a gyroscope cavity).

FIG. 6 shows an embodiment of a MEMS device 300 that includes an accelerometer 310 and a gyroscope 320. In some embodiments, the MEMS device 300 is formed by bonding a MEMS wafer 330 and a CMOS wafer 100. The bonding of the MEMS wafer 330 and the CMOS wafer 100 form at least two cavities 340, 350. The first cavity is an accelerometer cavity 340. The second cavity is a gyroscope cavity 350. In some embodiments, the accelerometer cavity 340 is isolated from the gyroscope cavity 350. The cavities 340, 350 can include the enclosures above and below the MEMS device layer 370. The accelerometer 310 and the gyroscope 320 generally operate under different pressures. Accordingly, the getters 215, 225 in the gyroscope cavity 350 can be used to reduce the initial pressure and/or maintain (e.g., stabilize) the pressure in the gyroscope cavity 350. The outgassing layer 200 in the accelerometer cavity 340 can be used to increase the initial pressure in the accelerometer cavity 340.

In the accelerometer cavity 340 according to some embodiments, the outgassing layer 200 is exposed to increase accelerometer cavity 340 pressure compared to the gyroscope cavity 350. The sensing electrode 180 includes, for example, an AlCu/second electrode layer stack. The shield electrode 170 includes, for example, AlCu or an AlCu/second electrode layer stack. The bonding electrode 160 includes, for example, AlCu. The conductive bump stop 190 is configured to provide a charge dissipation path when moving structures of the MEMS wafer 330 come into contact with the CMOS wafer 100.

In the gyroscope cavity 350 according to some embodiments, the outgassing layer 200 is not exposed. The sensing or shield electrode 170 includes, for example, an AlCu/getter electrode layer stack in which the getter electrode is different from the second electrode. The getter layer 225 is on top of the passivation SiN of SRO/SiN 130 and is electrically connected to the top metal layer 150 through the conductive bump stop layer 230. The bonding electrode 160 includes, for example, AlCu. The conductive bump stop 190 is configured to provide a charge dissipation path when moving structures of the MEMS wafer 330 come into contact with the CMOS wafer 100.

Figure 7B:
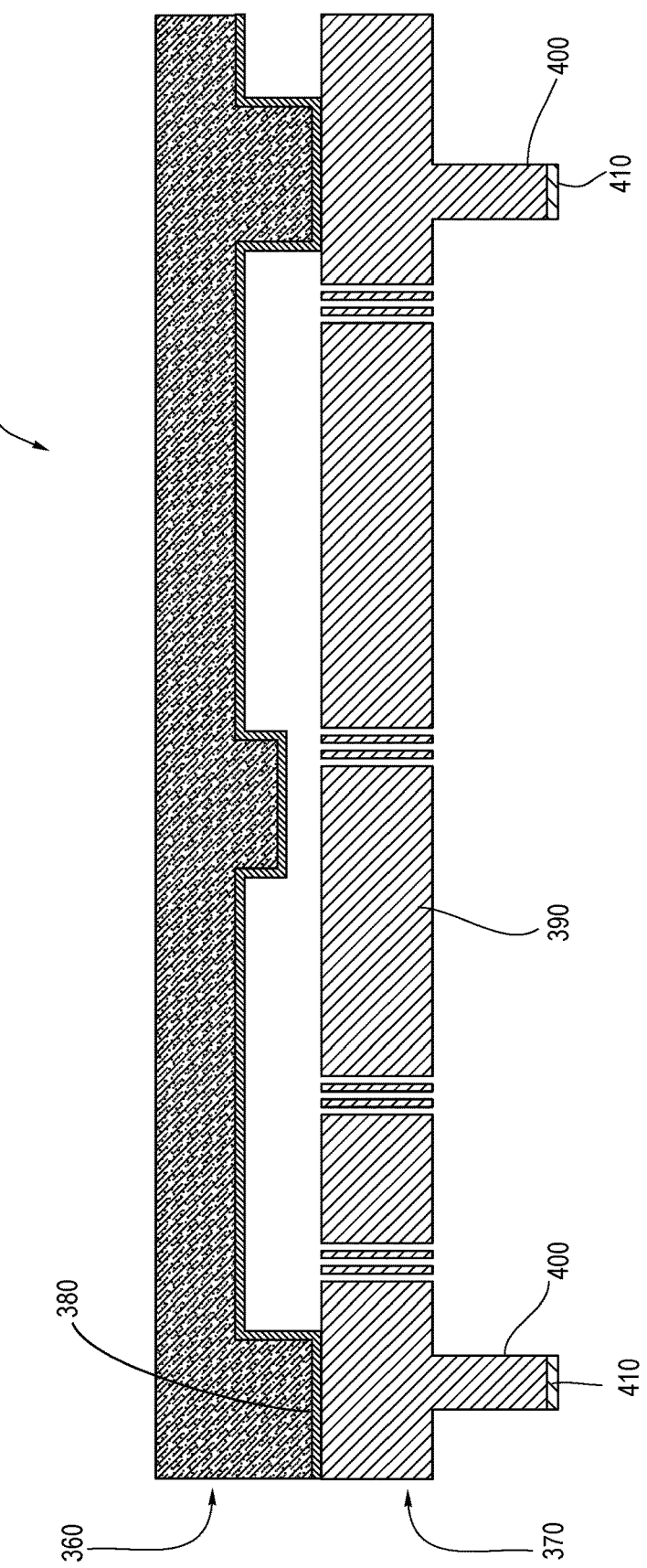
FIG. 7B shows an embodiment of an accelerometer portion of the MEMS device according to the present disclosure.

FIGS. 7A-C show an embodiment of the accelerometer 310 of the MEMS device 300 according to the present disclosure.

FIG. 7A shows an accelerometer portion of the CMOS wafer 100 that is ready for bonding to form the accelerometer cavity 340. The accelerometer portion of the CMOS wafer 100 includes, for example, bonding electrodes 160, an outgassing layer 220, a conductive bump stop 190, a shield electrode 170, and a shield and/or sensing electrode 180, and a conductive bump stop layer 230 that is configured to provide an electrical path to the top metal layer 150

FIG. 7B shows an accelerometer portion of the MEMS wafer 330 that is ready for bonding with the CMOS wafer 100 in FIG. 7A to form the MEMS device 300. In some embodiments, the MEMS wafer 330 includes a MEMS handle wafer 360 and a MEMS device layer 370, which both can be made of silicon, for example. A fusion bond oxide 380 is formed on the MEMS wafer 330 to facilitate the bond between the MEMS handle wafer 360 and the MEMS device layer 370 and to provide the electrical isolation between the MEMS handle wafer 360 and the MEMS device layer 370. The MEMS wafer 330 is configured to form at least a portion of the accelerometer cavity 340. The MEMS device layer 370 includes, for example, a MEMS proof mass 390 and standoffs 400. A germanium layer 410 is formed on the ends of the standoffs 400 to facilitate bonding between the MEMS wafer 330 and the CMOS wafer 100.

FIG. 7C shows the bonding between MEMS wafer 330 and the CMOS wafer 100 to form the accelerometer 310 portion of the MEMS device 300. In some embodiments, a eutectic bond seal ring 415 is formed after the germanium layer 410 is bonded to the AlCu of the bonding electrode 160.

Figure 8B:
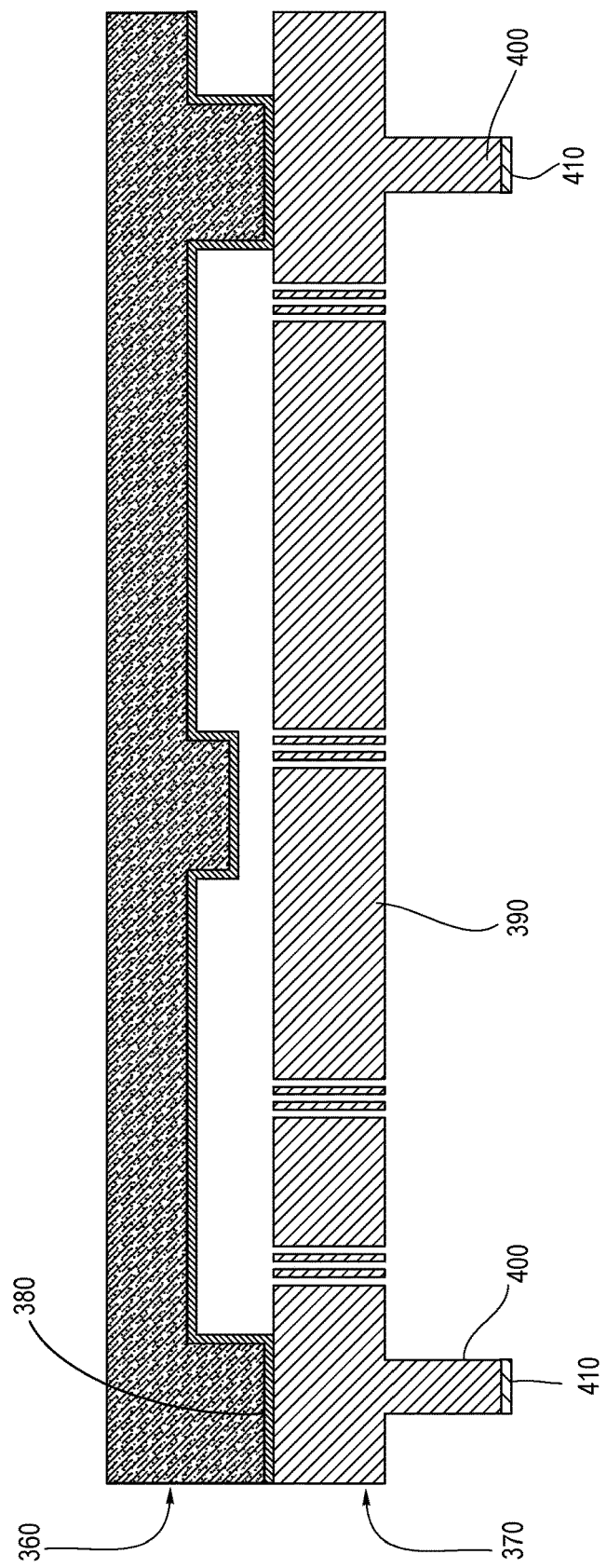
FIG. 8B shows an embodiment of a gyroscope portion of the MEMS device according to the present disclosure.
Figure 8C:
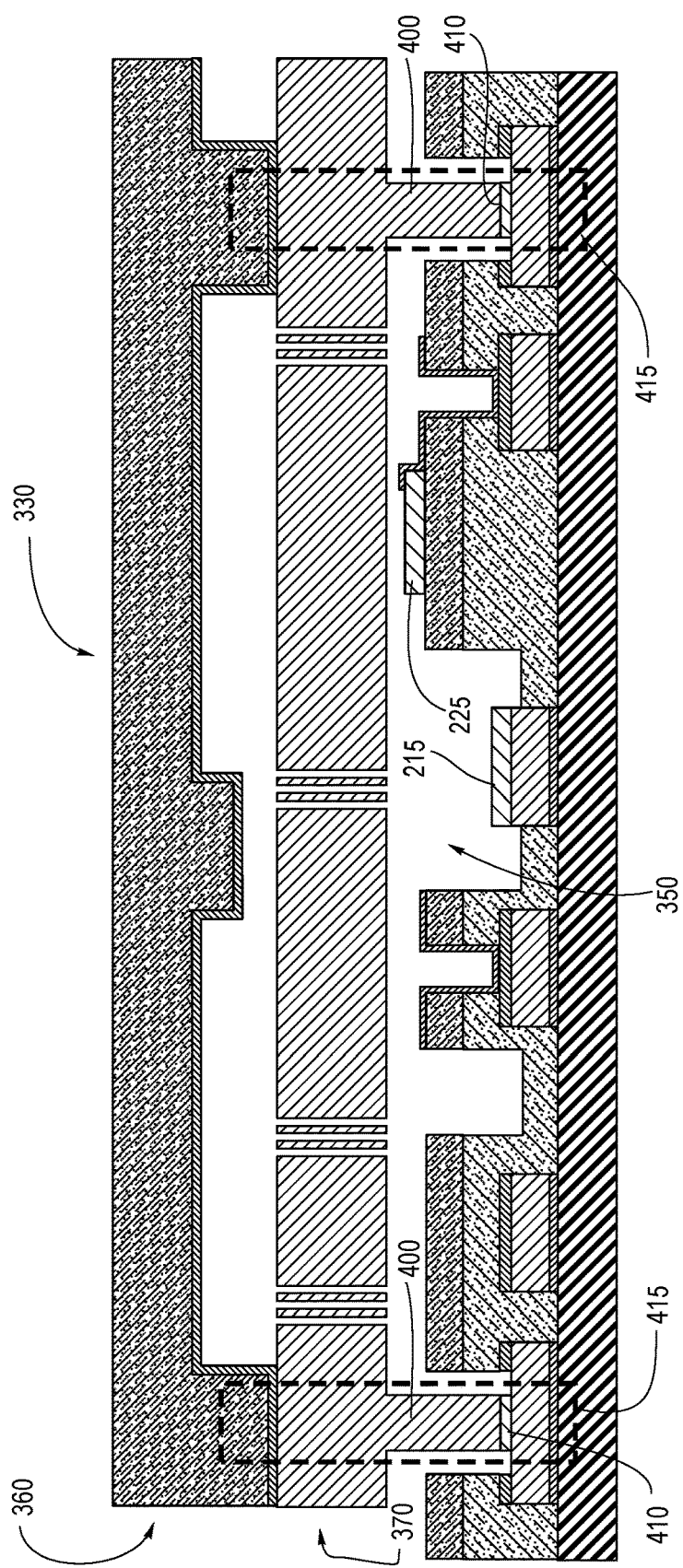
FIG. 8C shows an embodiment of a gyroscope portion of the MEMS device according to the present disclosure.

FIGS. 8A-C show an embodiment of the gyroscope 320 of the MEMS device 300 according to the present disclosure.

FIG. 8A shows a gyroscope portion of the CMOS wafer 100 that is ready for bonding to form the gyroscope cavity 350. The gyroscope portion of the CMOS wafer 100 includes, for example, bonding electrodes 160, a conductive bump stop 190, a shield and/or sensing electrode 170 formed by a first getter layer 215, a second getter 225, and a conductive bump stop layer 230 that is configured to provide an electrical path from the second getter 225 to the top metal layer 150.

FIG. 8B shows a gyroscope portion of the MEMS wafer 330 that is ready for bonding with the CMOS wafer 100 in FIG. 8A to form the MEMS device 300. In some embodiments, the MEMS wafer 330 includes a MEMS handle wafer 360 and a MEMS device layer 370, which both can be made of silicon, for example. A fusion bond oxide 380 is formed on the MEMS wafer 330 to facilitate the bond between the MEMS handle wafer 360 and the MEMS device layer 370 and to provide the electrical isolation between the MEMS handle and the MEMS device layer. The MEMS wafer 330 is configured to form at least a portion of the gyroscope cavity 350. The MEMS device layer 370 includes, for example, a MEMS proof mass 390 and standoffs 400. A germanium layer 410 is formed on the ends of the standoffs 400 to facilitate bonding between the MEMS wafer 330 and the CMOS wafer 100.

FIG. 8C shows the bonding between MEMS wafer 330 and the CMOS wafer 100 to form the gyroscope 320 portion of the MEMS device 300. In some embodiments, a eutectic bond seal ring is formed after the germanium layer 410 is bonded to the AlCu of the bonding electrode 160.

In some embodiments, the accelerometer portion and gyroscope portion are portions of the same CMOS wafer 100 and MEMS wafer 330. Thus, the flow processes to form, for example, the accelerometer portion and the gyroscope portion of the same CMOS wafer 100 occur concurrently as would be understood by one of ordinary skill in the art.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A method, comprising:
   bonding a microelectromechanical system (MEMS) wafer to a second wafer, the MEMS wafer and the second wafer having a first cavity and a second cavity therebetween;
   providing a first getter on the second wafer in the first cavity;
   integrating the first getter with an electrode, wherein the electrode is disposed over the first getter and the electrode is distinct from the first getter; and
   providing a second getter in the first cavity over a passivation layer on the second wafer.

2. The method according to claim 1, wherein the first cavity includes a gyroscope cavity, and the second cavity includes an accelerometer cavity.

3. The method according to claim 1, wherein the second wafer includes a complementary metal oxide semiconductor (CMOS) wafer.

4. The method according to claim 1, wherein the bonding includes bonding the MEMS wafer to the second wafer through a metal layer.

5. The method according to claim 1, wherein the integrating the first getter with the electrode includes depositing a first getter layer of the first getter over a metal layer of the electrode.

6. The method according to claim 5, wherein the first getter layer includes titanium, and the metal layer includes aluminum.

7. The method according to claim 1, comprising:
depositing a first getter layer of the first getter on a metal layer;
patterning the first getter layer;
depositing a barrier layer over the first getter layer and over the metal layer;
patterning one or more of the barrier layer, the first getter layer, and the metal layer to form stacks, wherein one or more of the stacks include the barrier layer, the first getter layer, and the metal layer;
depositing the passivation layer around the stacks;
selectively removing the passivation layer to expose one or more of the stacks; and
selectively removing the barrier layer to expose the first getter layer.

8. The method according to claim 1, comprising:
depositing a first getter layer of the first getter on a metal layer;
depositing a barrier layer on the first getter layer;
patterning one or more of the barrier layer, the first getter layer, and the metal layer to form stacks, wherein one or more of the stacks include the barrier layer, the first getter layer, and the metal layer;
depositing the passivation layer around the stacks;
selectively removing the passivation layer to expose one or more of the stacks; and
selectively removing the barrier layer to expose the first getter layer.

9. The method according to claim 1, comprising:
depositing a barrier layer on a metal layer;
depositing a first getter layer of the first getter on the barrier layer;
patterning one or more of the first getter layer, the barrier layer, and the metal layer to form stacks, wherein one or more of the stacks include the first getter layer, the barrier layer, and the metal layer;
depositing a passivation layer around the stacks;
selectively removing the passivation layer to expose one or more of the stacks; and
selectively removing the first getter layer to expose the barrier layer.

10. The method according to claim 1, wherein providing the second getter includes:
depositing a second getter layer of the second getter over the passivation layer;
patterning the second getter layer;
etching a via in the passivation layer after the patterning of the second getter layer;
depositing a conductive layer over the via and over the second getter layer; and
etching the conductive layer to expose a portion of the second getter layer, wherein the conductive layer provides a conductive path from the second getter layer, through the via, and to a metal layer of a bump stop.

11. The method according to claim 1, wherein providing the second getter includes:
etching a via in the passivation layer;
depositing a second getter layer of the second getter over the passivation layer and over the via;
depositing a conductive layer over the second getter layer;
pattern the conductive layer and the second getter layer; and
etching the conductive layer to expose the second getter layer.

12. The method according to claim 11, comprising electrically coupling a metal layer deposited on the second wafer and the second getter layer through the via in a bump stop.

13. The method according to claim 1, wherein providing the second getter includes:
etching a via in the passivation layer;
depositing a conductive layer over the passivation layer and the via;
depositing a second getter layer of the second getter over the conductive layer; and
patterning the conductive layer and the second getter layer.

14. The method according to claim 13, comprising:
selectively removing the second getter layer to expose the conductive layer.

15. The method according to claim 13, comprising electrically coupling a metal layer deposited on the second wafer and the second getter layer through the conductive layer and the via in the bump stop.

16. The method according to claim 1, wherein the first getter is used for sensing and gettering.

17. A system, comprising:
a microelectromechanical system (MEMS) wafer bonded to a second wafer, the MEMS wafer and the second wafer having a first cavity and a second cavity therebetween;
a first getter provided on the second wafer in the first cavity and integrated with an electrode on the second wafer, wherein the electrode is disposed over the first getter and the electrode is distinct from the first getter; and
a second getter provided in the first cavity over a passivation layer on the second wafer.

18. The system according to claim 17, wherein:
a first getter layer of the first getter is deposited on a metal layer and patterned,
a barrier layer is deposited over the first getter layer and over the metal layer,
one or more of the barrier layer, the first getter layer, and the metal layer are patterned to form stacks,
one or more of the stacks include the barrier layer, the first getter layer, and the metal layer,
the passivation layer is deposited around the stacks and selectively removed to expose the one or more of the stacks, and
the barrier layer is selectively removed to expose the first getter layer.

19. The system according to claim 18, wherein:
a second getter layer of the second getter is deposited over the passivation layer and patterned,
a via is etched in the passivation layer,
a conductive layer is deposited over the via and over the second getter layer, and
the conductive layer is etched to expose a portion of the second getter layer, wherein the conductive layer provides a conductive path from the second getter layer, through the via, and to a metal layer of a bump stop.

20. The system according to claim 17, wherein:
a first getter layer of the first getter is deposited on a metal layer,
a barrier layer is deposited on the first getter layer,
one or more of the barrier layer, the first getter layer, and the metal layer are patterned to form stacks, one or more of the stacks include the barrier layer, the first getter layer, and the metal layer, the passivation layer is deposited around the stacks and selectively removed the to expose the one or more of the stacks, and the barrier layer is selectively removed to expose the first getter layer.

21. The system according to claim 20, wherein:

a via is etched in the passivation layer, a second getter layer of the second getter is deposited over the passivation layer and over the via, a conductive layer is deposited over the second getter layer, the conductive layer and the second getter layer is patterned, and the conductive layer is etched to expose the second getter layer.

22. The system according to claim 17, wherein:

a barrier layer is deposited on a metal layer, a first getter layer of the first getter is deposited on the barrier layer, one or more of the first getter layer, the barrier layer, and the metal layer are patterned to form stacks, one or more of the stacks include the first getter layer, the barrier layer, and the metal layer, a passivation layer is deposited around the stacks and selectively removed to expose the one or more of the stacks, and the first getter layer is selectively removed to expose the barrier layer.

23. The system according to claim 22, wherein:

a via is etched in the passivation layer, a conductive layer is deposited over the passivation layer and over the via, a second getter layer of the second getter is deposited over the conductive layer, the second getter layer and the conductive layer is patterned, and the second getter layer is etched to expose the second getter layer.

24. A method, comprising:

bonding a microelectromechanical system (MEMS) wafer to a second wafer, the MEMS and the substrate having a first cavity and a second cavity therebetween;

providing a first getter on the substrate in the first cavity;

integrating the first getter with an electrode;

providing a second getter in the first cavity over a passivation layer on the substrate;

depositing a first getter layer of the first getter on a metal layer;

patterning the first getter layer;

depositing a barrier layer over the first getter layer and over the metal layer;

patterning one or more of the barrier layer, the first getter layer, and the metal layer to form stacks, wherein one or more of the stacks include the barrier layer, the first getter layer, and the metal layer;

depositing the passivation layer around the stacks;

selectively removing the passivation layer to expose one or more of the stacks; and selectively removing the barrier layer to expose the first getter layer.

* * * * *